Oct. 24, 1972 H. E. SATTERFIELD ET AL 3,700,547
BONDING PROCESS FOR POLYPHENYLENE OXIDEDIELECTRIC
MICROWAVE CIRCUITS AND BONDED ASSEMBLY
Filed Oct. 20, 1970
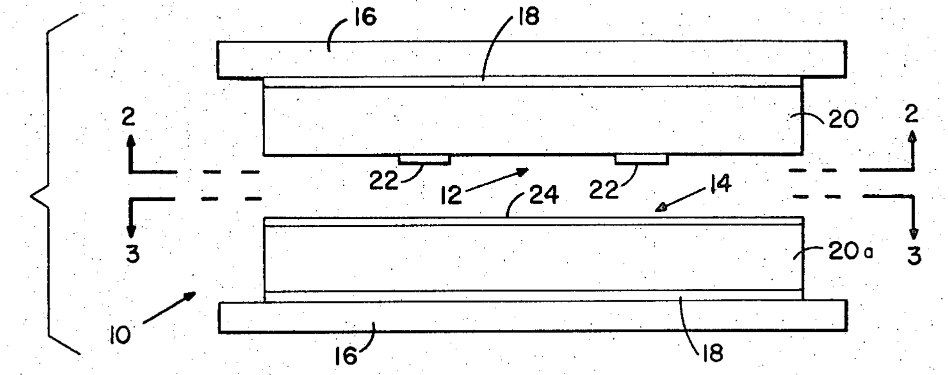
FIG. 1
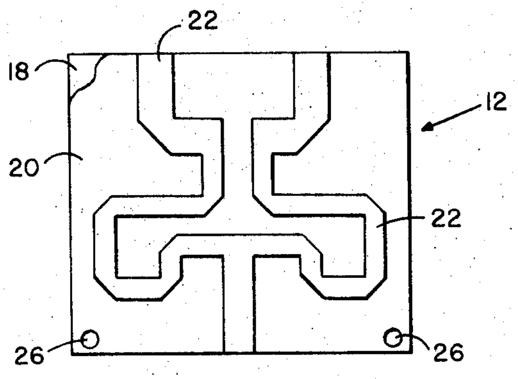
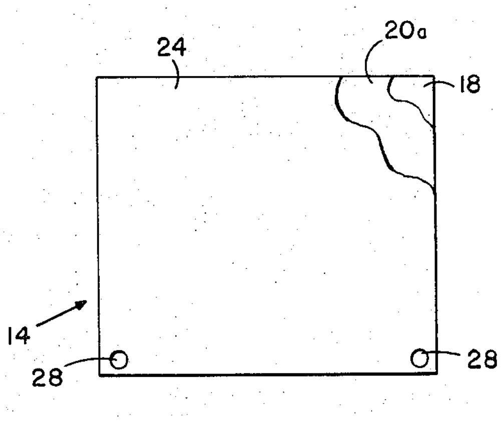
FIG. 2 FIG. 3
Homer E. Satterfield
Keith D. Stottlemyer
David L. Brown
Leslie (nmi) Roberts,
INVENTORS.
BY Jack W. Voigt
James T. Deaton United States Patent Office 3,700,547
Patented Oct. 24, 1972

3,700,547
BONDING PROCESS FOR POLYPHENYLENE OXIDEDIELECTRIC MICROWAVE CIRCUITS AND BONDED ASSEMBLY

Homer E. Satterfield, North Syracuse, N.Y., Keith D. Stottlemyer, Statesboro, Ga., and David L. Brown, Liverpool, and Leslie Roberts, Baldwinsville, N.Y., assignors to the United States of America as represented by the Secretary of the Army
Filed Oct. 20, 1970, Ser. No. 82,251
Int. Cl. C09j 5/06, 7/00
U.S. Cl. 161—213 11 Claims

ABSTRACT OF THE DISCLOSURE

Microwave striplines are formed by intimately bonding circuit planes to polyphenylene oxide shield planes by use of heat and pressure in combination with an interface bonding material comprised of a polymeric resin composed of a random copolymer product of copolymerization of ethylene and acrylic acid.

BACKGROUND OF THE INVENTION

Microwave stripline circuits of the prior art have been constructed by fastening the circuit plane to the shield plane by means of screws or rivets after completion of associated machining. Generally, the microwave stripline circuits are covered by a suitable cover constructed to meet the physical limitations of size and appropriate for the environment of use.

High-molecular-weight polyphenylene oxide has been utilized in microwave stripline circuits to position the ground circuit plane, transmission circuit plane, and shield plane. Means for fastening or securing the component parts have included screws or rivets and associated machining. The polyphenylene oxide is made by the oxidative polymerization of 2,6-dimethylphenol in the presence of a copper-amine-complex catalyst.

High-molecular-weight polyphenylene oxide has a useful temperature range of more than 600° F., excellent mechanical properties and dielectric characteristics, and unaffected by aqueous media. The polyphenylene oxide is considered an engineering quality thermoplastic which may be substituted for die cast metals in general.

Various methods for bonding polyphenylene oxide for use in stripline circuits have been considered. Liquid adhesive bonding has been tested with little, if any, success due to chemical incompatability of adhesive with polyphenylene oxide and failure of the adhesive to exhibit the necessary low dielectric constant and dissipation factor.

The use of solvent bonding has been considered as a means for bonding polyphenylene oxide. However, polyphenylene oxide is soluble to some degree in all chlorinated and aromatic hydrocarbons. As a result of contact with the specified solvents, stress crazing generally results which renders an assembly nearly impossible to machine. The solvent softening of the surface leads to problems such as copper circuit movement, solvent entrapment, and changes in circuit position relative to the ground planes. Complete solvent removal to prevent further polyphenylene oxide attack presents another problem.

A process to reliably bond polyphenylene oxide stripline circuits is desired and needed for reasons set forth hereinbelow. Properly implemented, such a process could offer substantial cost savings by eliminating standard hardware (screws or rivets) and associated machining. Covers may be eliminated in some applications.

A stripline bond must perform two basic functions: (1)

it must securely fasten the circuit and ground plane halves of stripline assembly together, and (2) it must at the same time act as an efficient path for the transmission of microwave energy. The bonding agent used to reliably bond polyphenylene oxide must meet rigid specification respective to the following considerations and factors:

(1) Dielectric constant, and its variation with frequency and temperature.

(2) Dissipation factor, and its variation with frequency and temperature.

(3) Homogeneity, uniformity, and isotropy of bond.

(4) Useful temperature range.

(5) Chemical compatibility with polyphenylene oxide.

(6) Dimensional stability with:

(a) Temperature,
(b) Aging, and
(c) Humidity.

(7) Bond strength:

(a) Shear, and
(b) Tensile.

(8) Repeatability of electrical characteristics after bonding.

An object of this invention is to provide a process for securely fastening together the circuit and ground plane halves of a stripline assembly.

Another object of this invention is to provide a process which employs a hot melt procedure for bonding which results in a product having an efficient path for the transmission of microwave energy.

Another object of this invention is to provide a polyphenylene oxide microwave stripline circuit which has good mechanical and dielectric properties and which does not require mechanical fastening means.

SUMMARY OF THE INVENTION

The process of this invention securely bonds polyphenylene oxide microwave stripline circuits when the inner surfaces of the circuit and shield plane are brought into intimate contact with a suitable interface material after which the entire assembly is subjected to a predetermined amount of heat and pressure for a predetermined period of time. The typical microwave stripline circuit of this invention is constructed of polyphenylene oxide, a ground circuit, transmission line circuit and an interface bonding material. A typical arrangement of the component parts results in a sandwich type configuration for the microwave assembly.

BRIEF DESCRIPTION OF THE DRAWINGS

In the description of this invention reference is made to the accompanying drawings hereby made a part of this application and in which:

FIG. 1 shows an exploded elevational view of a polyphenylene oxide dielectric microwave circuit 10 including ground and transmission circuits with only the outermost portion of transmission circuit being shown for clarity;

FIG. 2 is a sectional view taken along line 2—2 of FIG. 1, drawn to reduced scale, with a portion cut away and with the separator plate of FIG. 1 not shown; and FIG. 3 is a sectional view, taken along line 3—3 of FIG. 1, also drawn to reduced scale with portions cut away and with the separator plate of FIG. 1 not shown.

DESCRIPTION OF THE PREFERRED EMBODIMENT

In FIG. 1 are shown separator plates 16 for use in pressing the microwave assembly that is comprised of subassemblies 12 and 14. The microwave assembly comprises copper ground planes 18 which are clad to polyphenylene oxide shield planes 20 and 20a respectively, transmission circuit 22 which is etched on shield plane 20, interface bonding material 24 illustrated as disposed on shield plane 20a, alignment pins 26 (see FIG. 2) and alignment pin holder 28 (see FIG. 3) for receiving alignment pins 26 for aligning the shield planes when securing the assembly together as a sandwich.

Generally speaking, the bonding of polyphenylene oxide shield planes 20 and 20a is accomplished by bringing circuit 22 and shield planes 20 and 20a into intimate contact with suitable interface bonding material 24. The entire assembly is now subjected to heat and pressure through the use of press platens (not shown) and separator plates 16 for a predetermined period of time. After heating under pressure for the predetermined period of time, the assembly is cooled to complete the process.

The process for this invention employs platens having a means for heating. Steam heated or electrically heated platens capable of 350° F. and 460 p.s.i. are very satisfactory for use in accordance with this invention. A means for cooling platens is preferred for use to permit rapid cycling of processing. Polyphenylene oxide of from ⅛ to ¼ inch for the shield planes 20 and 20a which are used for positioning the ground circuit and the transmission circuit works well with the interface temperature of about 350° F. Polyphenylene oxide laminates (e.g. polyphenylene oxide laminated with a copper ground plane on the outer surface of each partial circuit and a copper transmission circuit on the inner surface of one of the partial circuits) are bonded together with an interface bonding material which is a polymeric resin composed of a random copolymer product of copolymerization of ethylene and acrylic acid. Since the process involves bonding polyphenylene oxide at the interface wherein the transmission lines are positioned, the interface temperature should be sufficiently high to ensure complete bonding in order that an efficient path is achieved for the transmission of microwave energy.

The preferred interface bonding material for the process of this invention is the specified polymeric resin, preferably in film or sheet form. The interface bonding material, a copolymerization product of ethylene and acrylic acid, contains approximately 8 weight percent of acrylic acid based on the copolymer weight. The copolymer has a Melt Index of approximately 5 decigrams per minute. For additional information on this copolymer of ethylene and acrylic acid refer to U.S. Pat. No. 3,239,370.

The process of this invention is best described by reference to the following detailed descriptions under (A), Equipment, and under (B), Preparation.

PRESSING PROCEDURE FOR STRIPLINE ASSEMBLIES USING POLYPHENYLENE OXIDE LAMINATES AND BONDING SHEET MATERIAL COMPOSED OF A RANDOM COPOLYMER PRODUCT OF COPOLYMERIZATION OF ETHYLENE AND ACRYLIC ACID

(A) Equipment (1) Press: Either steam heated or electrically heated platens capable of 350° F. and 460 p.s.i. on the largest circuit anticipitated. Platens should be water cooled for rapid cycling. The platens should be flat and parallel to ±1 mil.

(2) Fixture: Fixtures, as required, will depend on board configuration. If connectors are bonded into the assembly, a fixture will be required; if not, then only separator plates will be necessary.

(3) Alignment pins: The pins required are 0.155-inch diameter drill rod, press fit, knockout type. Length will be determined by thickness of completed buildup.

(4) Separator plates: Type 340 stainless 24 gauge (0.025-inch thick) No. 2B bright annealed finish.

CHEMICAL ANALYSIS

| | Percent |
|---|---|
| Carbon (maximum) | 0.12 |
| Manganese (maximum) | 0.50 |
| Phosphorus (maximum) | 0.03 |
| Sulphur (maximum) | 0.03 |
| Silicon (maximum) | 0.50 |
| Chromium | 14.0–18 |

(5) Oven: Recirculating type, stable temperature at 150° F.

(B) Preparation (1) The copper circuits etched on polyphenylene oxide should be free of oxides, grease, and dirt. (If they are tarnished or the polyphenylene oxide surfaces appear dirty, return to the etching area for cleaning.) The surfaces which are to be bonded should be wiped clean with a lint-free cloth, dampened with a non-aromatic alcohol (e.g., propanol).

(2) Wipe the surfaces of the interface bonding material with a lint-free cloth dampened in alcohol.

(3) Place circuit board and interface bonding material in oven at 150° F.±10° F., for 30 minutes to remove any moisture or alcohol. (These parts may be cooled prior to assembly.)

(4) Assemble the sandwich by placing the interface bonding material between the polyphenylene oxide partial circuits.

(5) Alignment pins, shorter than the thickness of the sandwich, should be used.

(6) If connectors are to be bonded into the assembly, they should b properly positioned and any screws used should be tight prior to bonding and a clearance fixture used to support the assembly during bonding. If connectors are not bonded in, separator plates may be used on either side of the assembly. The clearance fixture or separator plates should extend at least one inch beyond edges of the sandwich.

(7) Several thicknesses of 0.015-inch kraft paper (e.g. sulfate pulps; also known as kraft pulps) should be placed between the separator plates and the press platens.

(8) Press platens should be heated, prior to bonding, to a temperature of 330° F.±10° F.

(9) Insert sandwich and press using 420 p.s.i.±25 p.s.i., based on surface area, for 7 minutes±10 seconds. At the end of this period, shut off heat and cool platens with cold water until sandwich assembly temperature reaches about 100° F. (approximately five minutes).

(10) Release pressure, remove bonded assembly, and check for any obvious defects.

NOTE

It is important that the bonding surfaces be kept clean of dirt, dust, and grease, and fingerprints. It is recommended that white, lint-free gloves be used in the assembly process.

Polyphenylene oxide should not be subjected to aromatic or chlorinated solvents for cleaning. If dirty or tarnished, bonding surfaces should be cleaned with a cleaner which is compatible with polyphenylene oxide.

ELECTRICAL EVALUATION OF BONDED ASSEMBLIES

Table I, part (a), sets forth data for assemblies made with ⅛ polyphenylene oxide and 2-ounce copper. These assemblies were tested in a bolted configuration. A four-mil sheet of ethylene and acrylic acid copolymer was then placed between the polyphenylene oxide interfaces and the circuits bonded. Table I also lists the data pertinent to the bonded assemblies.

The average frequency decrease after bonding was 2.19 mHz. with maximum and minimum decreases of 2.49 and 1.92 mHz., respectively. The effective change in dielectric constant can be calculated as follows:

$$\Delta E_p = \frac{\Delta f}{f_0} \cdot 2E_P$$

where $f_0$=initial center frequency in bolted configuration
$\Delta f$=change in $f_0$ due to bonding
$E_p$=dielectric constant of copolyphenylene oxide (2.55)

The effective change in dielectric constant due to bonding was −0.0129 as varied by a value of plus 0.0017 to minus 0.0016, which is nearly within the original polyphenylene oxide specification tolerance of plus or minus 0.01.

Additional electrical tests were made on five ⅛-inch polyphenylene oxide 1-ounce copper filter assemblies bonded with a 2-mil sheet of copolymer. The data and effective change in dielectric constant due to bonding is −0.0080, as varied by a value of plus 0.0014 to minus 0.0016, as set forth in Table I, part (b).

TABLE I (a) Test filter ⅛-inch plus or minus 0.004 polyphenylene oxide; 2-ounce copper; 4-mil ethylene and acrylic acid copolymer

| Assembly no. | Bolted assembly, $f_0$ (mHz.) | Bonded assembly, $f_0$ (mHz.) | $\Delta f_0$ (mHz.) | $\Delta E_p$ |
|---|---|---|---|---|
| 1 | 434.40 | 431.99 | −2.41 | −0.0143 |
| 2 | 434.18 | 431.99 | −2.19 | −0.0129 |
| 3 | 434.29 | 432.04 | −2.25 | −0.0133 |
| 4 | 434.10 | 432.18 | −1.92 | −0.0112 |
| 5 | 434.24 | 432.19 | −2.05 | −0.0115 |
| 6 | 433.89 | 431.74 | −2.15 | −0.0122 |
| 7 | 434.03 | 431.54 | −2.49 | −0.0145 |
| 9 | 434.17 | 432.03 | −2.14 | −0.0125 |
| 10 | 434.85 | 431.73 | −2.12 | −0.0125 |

Average $\Delta f_0$—2.19. Average $\Delta E_p$—0.013.

(b) Test filter ⅛-inch plus or minus 0.004 polyphenylene oxide; 1-ounce copper 2-mil ethylene and acrylic acid copolymer

| Assembly no. | Bolted assembly, $f_0$ (mHz.) | Bonded assembly, $f_0$ (mHz.) | $\Delta f_0$ (mHz.) | $\Delta E_p$ |
|---|---|---|---|---|
| 1 | 433.47 | 432.22 | −1.25 | −0.0074 |
| 2 | 433.64 | 432.53 | −1.11 | −0.0064 |
| 3 | 433.57 | 432.22 | −1.35 | −0.0079 |
| 4 | 433.74 | 432.15 | −1.59 | −0.0088 |
| 5 | 433.19 | 432.59 | −1.60 | −0.0094 |

Average $f\Delta_0$—1.38. Average $\Delta E_p$—0.0080.

MECHANICAL EVALUATION OF BONDED TEST SAMPLES

Lap shear and tensile tests were performed to evaluate the interface bonding material of this invention with respect to material bond of polyphenylene oxide to polyphenylene oxide and polyphenylene oxide to copper. Tests were performed according to ASTM standards at room temperature and elevated temperatures of 35° C. and 50° C.

Test samples were prepared from ⅛ inch ±0.004 inch polyphenylene oxide laminate clad two sides with 2–ounce copper. Tensile samples were 1- by 1-inch squares with copper removed one side to give polyphenylene oxide to polyphenylene oxide and polyphenylene oxide to copper bonding conditions. Lap shear samples were 1- by 6-inch strips with copper removed one side. All test samples were bonded using a four-mil thickness of the specified interface bonding material.

The test data for lap shear tests at a pull rate of 0.5 inch per minute averaged in excess of 600 p.s.i. for the polyphenylene oxide to polyphenylene oxide bond and the polyphenylene oxide to copper bond. The test data for the tensile samples are based on samples which were bonded together and secured to aluminum blocks using an epoxy compound cured for 72 hours at room temperature. The samples were tensile tested, and the results indicate that the polyphenylene oxide to polyphenylene oxide bond and polyphenylene oxide to copper bond far exceeds any design requirements. The tensile testing resulted in a failure of epoxy bond between polyphenylene oxide and aluminum at pull values between 900 pounds and 2400 pounds. These results indicate that the bonds between polyphenylene oxide and polyphenylene oxide and the bonds between polyphenylene oxide and copper are very satisfactory.

The bonding process of this invention is especially suitable for stripline circuits which can be made at a substantial cost savings by eliminating standard screws or rivets and associated machining. The bonding process can be used for small (e.g., one-square inch) or large (e.g., 200 square-inch) surfaces. Of the several hundred stripline assemblies bonded, no assembly bond has failed mechanically and every assembly that has had the copper etched off to expose the bond has been void-free.

Several circuits which had previously failed under high power in a bolted configuration were remade in a bonded configuration. None of these circuits have subsequently failed under high power (kilowatts).

The bonding process of this invention meets the stringent requirements of polyphenylene oxide stripline circuits. It has the low loss requirements necessary at high frequencies and provides adequate bond strengths for this type of assembly. The bond is homogenous and void-free thus eliminating air gaps between circuit and shield planes to thereby allow circuit to transmit more power. Another very desirable feature of the process is recognized upon examination and testing for degradation of the base polyphenylene material. Examination and testing of the bonded assemblies indicate that no degradation of the base polyphenylene oxide has taken place. Although this development is primarily for bonding of polyphenylene oxide microwave stripline assemblies, it is indicated that this process may be used to bond multilayer printed circuits for high frequency applications where dielectric constant and dissipation factor are prime considerations. Bonding of backer plates to the stripline assemblies may be appropriate in some assemblies and can be done quite satisfactorily by the bonding process of this invention. An assembly to be bonded may be comprised of a plurality of members having inner and outer planar surfaces. The inner or outer planar surfaces may have a transmisison line circuit thereon for bonding together as an assembly. For example, at least two polyphenylene oxide members, having inner and outer planar surfaces, with a transmission line circuit secured to one of the inner surfaces may be bonded together to form a basic assembly. The outer planar surfaces of the basic assembly may be bonded to backer plates, ground circuits, to other assemblies, etc.

We claim:

1. A process for intimately bonding together the inner surfaces of a polyphenylene oxide dielectric microwave stripline circuit assembly composed of a ground circuit, a transmission line circuit, polyphenylene oxide shield planes, and an interface bonding material composed of a random copolymer product of polymerization of ethylene and acrylic acid, said acrylic acid content being about 8 weight percent based on weight of said copolymer product, said assembly characterized by having no appreciable change in dielectric constant due to said bonding together of said inner surfaces of polyphenylene oxide, said process comprising the steps of:

(a) preparing the surface of said transmission line circuit, polyphenylene oxide surfaces, and the interface bonding material surfaces of said assembly for bonding;
(b) drying said assembly;
(c) placing said interface bonding material between inner surfaces of said polyphenylene oxide shield planes to form a sandwich assembly comprised of a first partial circuit containing polyphenylene oxide having a ground circuit on the outer surface of said polyphenylene oxide and a transmisison circuit on the inner surface of said polyphenylene oxide, and a second partial circuit containing polyphenylene oxide having a ground circuit on the outer surface of said polyphenylene oxide;

(d) inserting said sandwich assembly between heated press platens;

(e) subjecting said sandwich assembly to a predetermined amount of pressure and heat from said press platens and for a predetermined period of time; and at the end of said predetermined period of time, (f) cooling said press platens and said sandwich assembly to a predetermined temperature; and thereafter, (g) releasing said pressure from said sandwich assembly to complete said process of intimately bonding together the inner surfaces of said polyphenylene oxide shield planes of said polyphenylene oxide dielectric microwave circuit.

2. The process of claim 1 and wherein said step of preparing includes cleaning said surfaces to remove oxides, grease, and dirt and wiping said surfaces with a lint-free cloth, dampened with alcohol; said step of drying is accomplished at a temperature at about 150° F.±10° F. for a period of time of about 30 minutes; said step of placing includes the use of alignment pins shorter than the thickness of said sandwich assembly; said step of inserting said sandwich assembly includes placing separator plates having positioned thereon several thicknesses of kraft paper, said separator plates being positioned between said first and said second partial circuits and said press platens, said kraft paper being positioned between said separator plates and said press platens; the amount of pressure and heat to which said sandwich assembly is subjected is 420 p.s.i.±25 p.s.i. and 330° F.±10° F. for the predetermined time of 7 minutes±10 seconds; said step of cooling is accomplished with cold water until said sandwich assembly temperature reached about 100° F.

3. The process of claim 1 and wherein prior to said step of placing said interface bonding material, connectors to be bonded in said sandwich assembly are properly positioned within said assembly.

4. A process for intimately bonding together the interfaces of polyphenylene oxide material with one of said interfaces having a printed circuit thereon, said process comprising placing an interface bonding material between said interfaces to form a sandwich assembly composed of said polyphenylene oxide material, said printed circuit, and said bonding material, said bonding material being composed of a random copolymer product of polymerization of ethylene and acrylic acid, said acrylic acid content being about 8 weight percent based on weight of said copolymer product; subjecting said sandwich assembly to a predetermined amount of pressure and heat for a predetermined period of time; at the end of said predetermined period of time, cooling said sandwich assembly to a predetermined temperature; and thereafter, releasing said pressure from said sandwich assembly to complete said process of intimately bonding.

5. The process of claim 4 wherein prior to said placing of said interface bonding material, each surface of said interfaces to be bonded are cleaned to remove undesirable substances therefrom.

6. The process of claim 4 wherein prior to said placing of said interface bonding material, connectors to be bonded in said sandwich assembly are properly positioned within said assembly.

7. The process of claim 6 wherein said predetermined amount of pressure and heat to which said sandwich assembly is subjected is 420 p.s.i.±25 p.s.i. and 330° F. ±10° F. for the predetermined time of 7 minutes±10 seconds; and said cooling results in a predetermined temperature of the sandwich assembly of about 100° F.

8. An assembly for use in electrical high frequency applications where dielectric constant and dissipation factor are prime considerations, said assembly comprised of at least two polyphenylene oxide members, each of said members having inner and outer planar surfaces with one of said inner planar surfaces having a transmission line circuit thereon; said polyphenylene oxide members being intimately bonded together at said inner planar surfaces by an interface bonding material composed of a random copolymer product of polymerization of ethylene and acrylic acid, said acrylic acid content being about 8 weight percent based on weight of said copolymer product; said assembly characterized by having no appreciable change in dielectric constant due to said bonding together of said polyphenylene oxide members.

9. The assembly of claim 8 wherein each of said outer planar surfaces has a planar ground circuit bonded thereto.

10. The assembly of claim 9 wherein said copolymer has substantially constant uniform thickness between said inner planar surfaces, said copolymer utilized being characterized by having a melt index of approximately 5 decigrams per minute; and said dielectric change being in the range of a decrease in value of from about 0.0064 to about 0.0145 from the dielectric constant of said polyphenylene oxide.

11. The assembly of claim 10 wherein said transmission line circuit is etched on said inner planar surface.

References Cited

UNITED STATES PATENTS

| | | | |
|---|---|---|---|
| 3,558,423 | 1/1971 | Rossetti, Jr. | 156—306 X |
| 3,239,370 | 3/1966 | Thomson et al. | 117—138.8 |
| 3,527,665 | 9/1970 | Wright et al. | 156—327 X |

RICHARD D. LOVERING, Primary Examiner

U.S. Cl. X.R.

156—182, 306, 311, 327; 161—182, DIG 7